United States Patent
Lee et al.

(10) Patent No.: US 8,796,803 B2
(45) Date of Patent: Aug. 5, 2014

(54) IMAGE SENSORS AND METHODS OF FORMING THE SAME

(71) Applicant: Samsung Electronics Co., Ltd., Gyeonggi-do (KR)

(72) Inventors: YunKi Lee, Seoul (KR); Seunghoon Kim, Seoul (KR); Yongsick Kim, Seoul (KR); Changrok Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/767,135

(22) Filed: Feb. 14, 2013

(65) Prior Publication Data

US 2013/0234273 A1    Sep. 12, 2013

(30) Foreign Application Priority Data

Mar. 6, 2012    (KR) .......................... 10-2012-0022835

(51) Int. Cl.
*H01L 31/102*    (2006.01)

(52) U.S. Cl.
USPC .................................... 257/440; 257/E27.13

(58) Field of Classification Search
CPC .................................................. H01L 27/1463
USPC ..................... 257/440, 452, E27.13, E25.005
See application file for complete search history.

(56) References Cited

U.S. PATENT DOCUMENTS

| | | | |
|---|---|---|---|
| 7,638,348 B2 | 12/2009 | Cho | |
| 7,651,884 B2 | 1/2010 | Park | |
| 7,701,635 B2 | 4/2010 | Shim | |
| 7,947,526 B2 | 5/2011 | Chang | |
| 2005/0085087 A1 | 4/2005 | Okigawa et al. | |
| 2009/0189302 A1 | 7/2009 | Fujita et al. | |
| 2011/0057279 A1 | 3/2011 | Lee et al. | |
| 2011/0309462 A1* | 12/2011 | Sargent et al. ................. | 257/443 |

FOREIGN PATENT DOCUMENTS

| | | |
|---|---|---|
| JP | 2006-261211 | 9/2006 |
| JP | 2007-279380 | 10/2007 |
| JP | 2009-283557 | 12/2009 |
| JP | 2011-009389 | 1/2011 |
| KR | 1020090046148 A | 5/2009 |
| KR | 1020110072520 A | 6/2011 |

* cited by examiner

*Primary Examiner* — Caridad Everhart
(74) *Attorney, Agent, or Firm* — Myers Bigel Sibley & Sajovec, P.A.

(57) ABSTRACT

The inventive concept provides image sensors and methods of forming the same. In the image sensor, a surface trap region may be disposed to be adjacent to a surface of a substrate lens component. Thus, a dark current characteristic may be improved.

8 Claims, 11 Drawing Sheets

IMAGE SENSORS AND METHODS OF FORMING THE SAME

CROSS-REFERENCE TO RELATED APPLICATIONS

This U.S. non-provisional patent application claims priority under 35 U.S.C. §119 to Korean Patent Application No. 10-2012-0022835, filed on Mar. 6, 2012, the entirety of which is incorporated by reference herein.

BACKGROUND

The inventive concept relates to image sensors and methods of forming the same.

Image sensors are semiconductor devices that can convert optical images into electric signals. The image sensors may be classified into a charge coupled device (CCD) type image sensor and a complementary metal oxide semiconductor (CMOS) type image sensor. CIS (CMOS image sensor) is an acronym for the CMOS type image sensor. The CIS may include a plurality of pixels which are two-dimensionally arranged. Each of the pixels may include a photodiode (PD). The PD converts an incident light into an electric signal.

As semiconductor devices become more highly integrated, the image sensors also become more highly integrated. The size of the pixels may become smaller with higher integration, such that cross talk between the pixels may occur and noise of the signal may increase.

SUMMARY

Embodiments of the inventive concept may provide image sensors capable of increasing light concentration, decreasing interference, and improving a dark current characteristic.

Embodiments of the inventive concept may also provide methods of forming an image sensor capable of providing various silicon lens shapes.

In one aspect, an image sensor may include: a substrate including a first surface, a second surface on which light is incident, and a plurality of pixels, the first and second surfaces being opposite to each other; a photoelectric conversion part formed in the substrate of each of the pixels; a multi-layered interconnection and a multi-layered interlayer insulating layer on the first surface; a substrate lens part protruding from the second surface; and a surface trap region adjacent to a surface of the substrate lens part.

In some embodiments, the substrate lens part may have a flat top surface. At this time, an edge portion of the substrate lens part may protrude more than the flat top surface.

In other embodiments, the substrate lens part may have a semi-spherical shape.

In still other embodiments, the surface trap region may include at least one of boron, boron fluoride, fluorine, carbon, and germanium.

In even other embodiments, the surface trap region may be conformally distributed along a surface of the substrate lens part.

In yet other embodiments, the substrate lens part and the substrate may constitute one body; and the photoelectric conversion part may extend to be in contact with the surface trap region.

In another aspect, a method of forming an image sensor may include: preparing a substrate including a first surface and a second surface on which light is incident, the first and second surfaces being opposite to each other; forming a photoelectric conversion part in the substrate adjacent to the first surface; partially removing the substrate adjacent to the second surface to form a substrate pattern; and irradiating a laser on a surface of the substrate pattern to change a shape of the substrate, thereby forming a substrate lens part.

In some embodiments, the method may further include: doping the substrate adjacent to the second surface with impurities.

In other embodiments, a dose amount of the impurities may have a range of about $1\times10^{12}$ atoms/cm$^2$ to about $1\times10^{16}$ atoms/cm$^2$.

In still other embodiments, the impurities may be diffused and activated at a surface of the substrate lens part by irradiating the laser.

In even other embodiments, the substrate pattern may be heated at a temperature within a range of about 1000 degrees Celsius to about 1450 degrees Celsius by irradiating the laser.

In yet other embodiments, the laser may have a wavelength within a range of about 308 nm to about 550 nm and an energy density within a range of about 0.5 J/cm$^2$ to about 3 J/cm$^2$.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
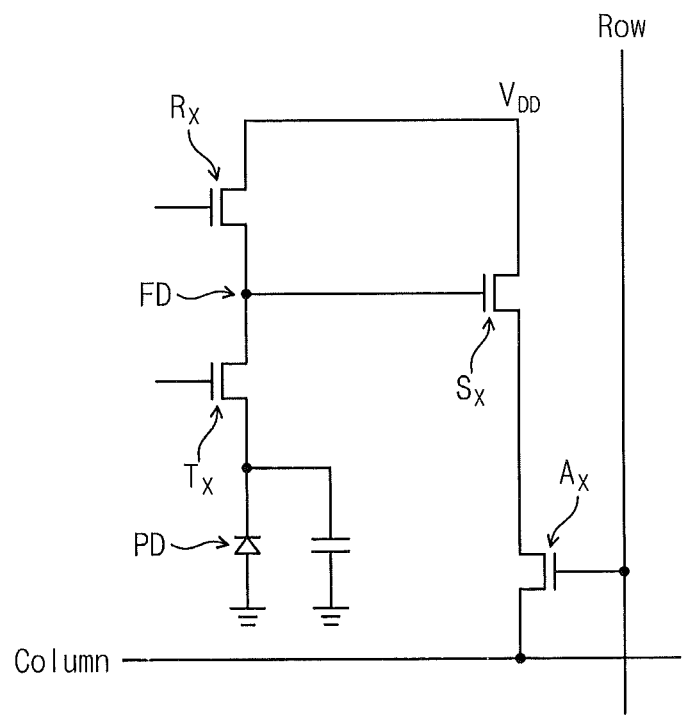
FIG. 1 is an equivalent circuit diagram illustrating an image sensor according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concept will be described in detail with reference to the drawings.

FIG. 1 is an equivalent circuit diagram illustrating an image sensor according to embodiments of the inventive concept.

Referring to FIG. 1, each of pixels of the image sensor may include a photoelectric conversion region PD, a transfer transistor Tx, a selection transistor Sx, a reset transistor Rx, and an access transistor Ax. A plurality of photoelectric conversion parts vertically overlapped with each other may be provided in the photoelectric conversion region PD. Each of the photoelectric conversion parts may be a photodiode including an N-type dopant region and a P-type dopant region. A transfer gate of the transfer transistor Tx may extend into a semiconductor epitaxial layer. A drain of the transfer transistor Tx may be a floating diffusion region FD. The floating diffusion region FD may correspond to a source of the reset transistor Rx. The floating diffusion region FD may be electrically connected to a selection gate of the selection transistor Sx. The selection transistor Sx and the reset transistor Rx may be connected in series to each other. The selection transistor Sx may be connected to the access transistor Ax. The reset transistor Rx, the selection transistor Sx, and the access transistor Ax may be shared by neighboring pixels. Thus, the integration degree of the image sensor may be improved.

A method of operating the image sensor will be described with reference to FIG. 1. First, a power voltage VDD may be applied to drains of the reset transistor Rx and the selection transistor Sx in the state that light is interrupted, so that charges remaining in the floating diffusion region FD may be outputted. Thereafter, the reset transistor Rx may be turned-off and light and an external light may be incident upon the photoelectric conversion region PD, so that electron-hole pairs (EHPs) may be generated in the photoelectric conversion region PD. Holes may be moved to and then accumulated in the P-type dopant region and electrons may be moved to and then accumulated in the N-type dopant region. When the transfer transistor Tx is turned-on, charges such as the electrons and the holes may be transferred to and then accumulated in the floating diffusion region FD. A gate bias of the selection transistor Sx may be changed in proportion to the amount of accumulated charges, so that a source potential of the selection transistor Sx may be changed. At this time, if the access transistor Ax is turned-on, a signal caused by the charges may be sensed through a column line.

As the image sensor becomes more highly integrated, the size of the photoelectric conversion region PD may become reduced so that the amount of receiving light may become reduced. According to embodiments of the inventive concept, a potential barrier region may be disposed under a device isolation layer separating the pixels from each other so that cross talk between the pixels may be decreased or prevented.

Figure 2:
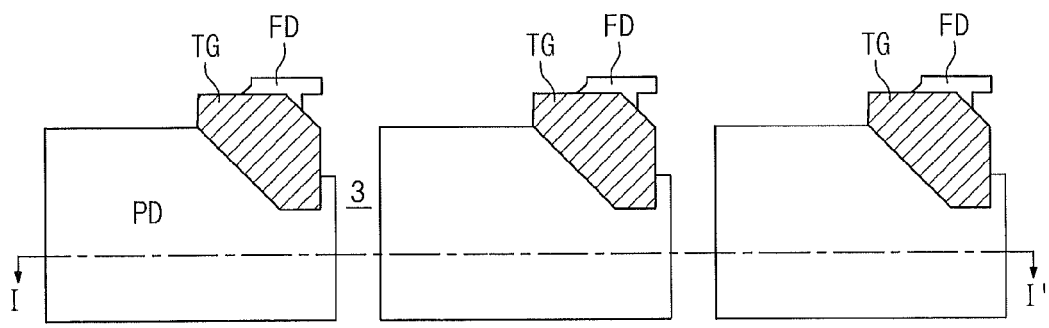
FIG. 2 is a plan view illustrating an image sensor according to embodiments of the inventive concept.
Figure 3:
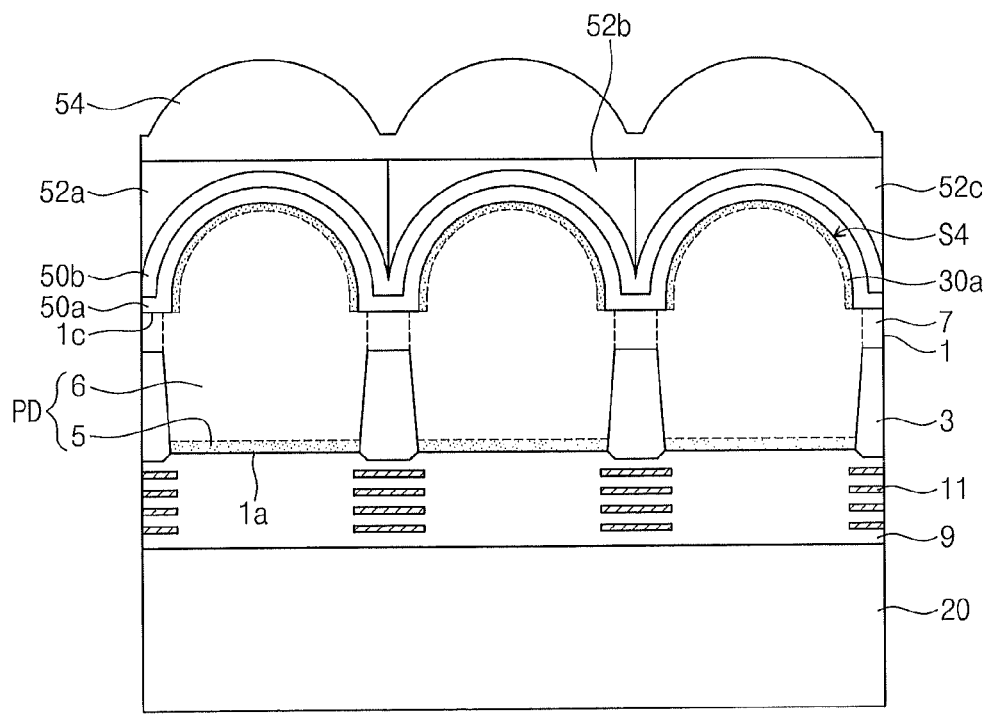
FIG. 3 is a cross-sectional view taken along a line I-I' of FIG. 2 to illustrate an image sensor according to embodiments of the inventive concept.

FIG. 2 is a plan view illustrating an image sensor according to embodiments of the inventive concept. FIG. 3 is a cross-sectional view taken along a line I-I' of FIG. 2 to illustrate an image sensor according to embodiments of the inventive concept.

Referring to FIGS. 2 and 3, for example, three neighboring pixel regions of a back-side receiving light image sensor are illustrated in FIGS. 2 and 3. The pixel regions may be separated from each other by a device isolation layer 3 and a device isolation doped layer 7 formed on a substrate 1. Each of the pixel regions may include a photoelectric conversion part PD, a transfer transistor Tx including a transfer gate TG adjacent thereto, and a floating diffusion region FD. The selection transistor Sx, the reset transistor Rx, and the access transistor Ax are omitted in FIG. 2. The photoelectric conversion part PD may include a first type dopant region 5 and a second type dopant region 6. The first type dopant region 5 may be doped with, for example, P-type dopants. The second type dopant region 6 may be doped with, for example, N-type dopants such as antimony, arsenic and phosphorus. The substrate 1 includes a first surface 1a and a second surface 1c. Interconnection layers 11 and an interlayer insulating layer 9 are disposed on the first surface 1a. The interlayer insulating layer may be multi-layered. A support substrate 20 may be disposed on the first surface 1a with the interlayer insulating layer 9 therebetween. A substrate lens part S4 may protrude from the second surface 1c. In the present embodiment, the substrate lens part S4 may have a semi-spherical shape. The substrate lens part S4 and the substrate 1 may constitute one body. In other words, the substrate lens part S4 may be in contact with the substrate 1 without an interface therebetween. If the substrate 1 is formed of single-crystalline silicon, the substrate lens part S4 may be formed of single crystalline silicon connected continuously from the substrate 1. A surface trap region 30a may be conformally disposed along a surface of the substrate lens part S4. The surface trap region 30a may trap undesired charges generated from the photoelectric conversion part PD in a dark state. Thus, a dark current characteristic may be improved. The surface trap region 30a may be doped with at least one of boron, boron fluoride, fluorine, carbon, and germanium. The photoelectric conversion part PD may extend into the substrate lens part S4 and be in contact with the surface trap region 30a. Thus, the photoelectric conversion part PD may become wider, so that a photo current may increase. Thus, light sensitivity may be improved.

A first reflection preventing layer 50a and a second reflection preventing layer 50b may be conformally disposed on the substrate lens part S4. Color filters 52a, 52b, and 52c, which correspond to the pixels, respectively, may be disposed on the first and second preventing layers 50a and 50b. For example, the color filters 52a, 52b, and 52c may include a red color filter, a blue color filter, and a green color filter. Even though not shown in the drawings, a planarization layer may be disposed on or under the color filters 52a, 52b, and 52c. Micro lenses 54 may be disposed on the color filters 52a, 52b, and 52c. In the image sensor according to the present embodiment, the substrate lens part S4 may be disposed between the micro lens 54 and the photoelectric conversion part PD. Accordingly, light concentration of the image sensor may increase or be maximized, and interference between the pixels may decrease.

FIGS. 4 to 7 and 9 are cross-sectional views presenting a method of forming the image sensor having the cross section of FIG. 3.

Figure 4:
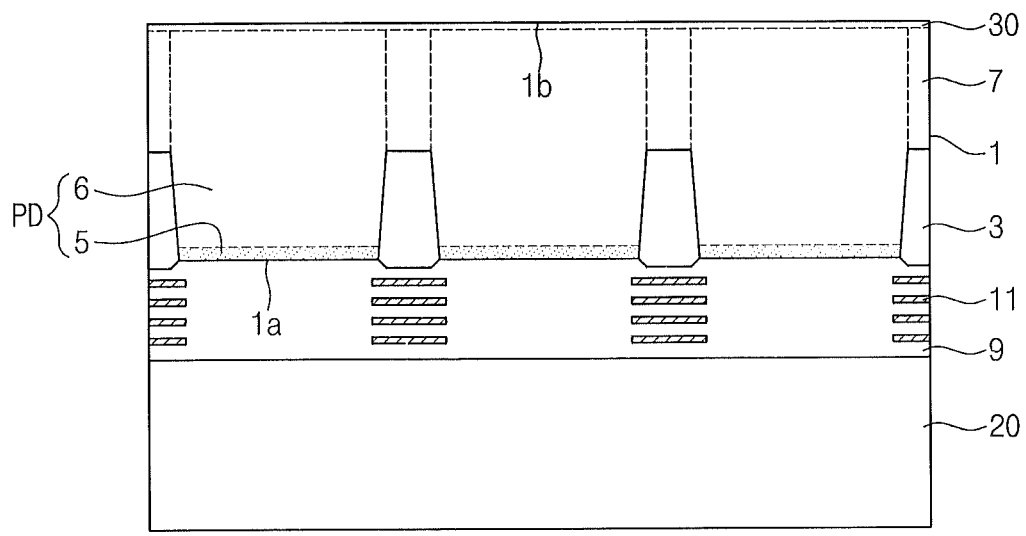
FIGS. 4 to 7 and 9 are cross-sectional views of a method of forming the image sensor having the cross section of FIG. 3.

Referring to FIG. 4, a device isolation layer 3 may be formed on a substrate 1 including a first surface 1a and a second surface 1b, thereby defining pixel regions. A plurality of ion-implantation processes may be performed to form a photoelectric conversion part PD including a first type dopant region 5 and a second type dopant region 6 in the substrate 1. A device isolation doped region 7 may be formed under the device isolation layer 3. The device isolation doped region 7 may be doped with, for example, P-type dopants such as boron, aluminum and gallium. Transistors (not shown), a plurality of interconnection layers 11 and an interlayer insulating layer 9 may be formed on the first surface 1a. After a support substrate 20 may be adhered to a top of the interlayer insulating layer 9, the substrate 1 may be inverted so that the second surface 1b faces upward. Then impurities may be injected into a substrate 1 adjacent to the second surface 1b, thereby forming a preliminary surface trap region 30. In the preliminary surface trap region 30, a lattice, structure of a material constituting the substrate 1 (e.g., single crystalline silicon) may be partial broken by the injection of the dopants. Thus, the preliminary surface trap region 30 may have an amorphous state. An injecting dose amount of the impurities for the preliminary surface trap region 30 may have a range of about $1\times10^{12}$ atoms/cm$^2$ to about $1\times10^{16}$ atoms/cm$^2$.

Figure 5:
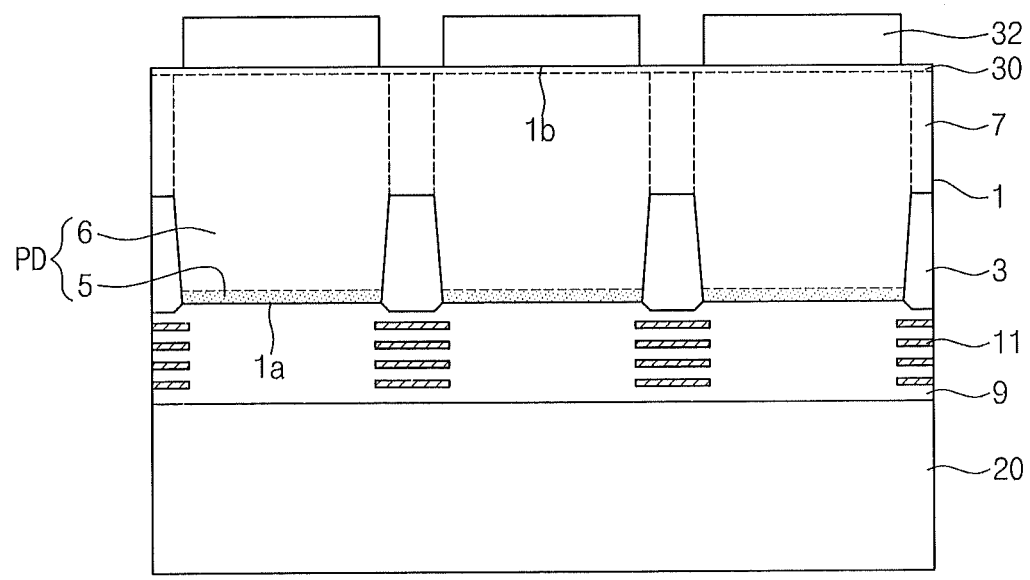

Referring to FIG. 5, photoresist patterns 32 may be formed on the second surface 1b. Each of the photoresist patterns 32 may have a cross section of a quadrangle-shape. The photoresist patterns 32 may correspond to the pixel regions, respectively, and be spaced apart from each other.

Figure 6:
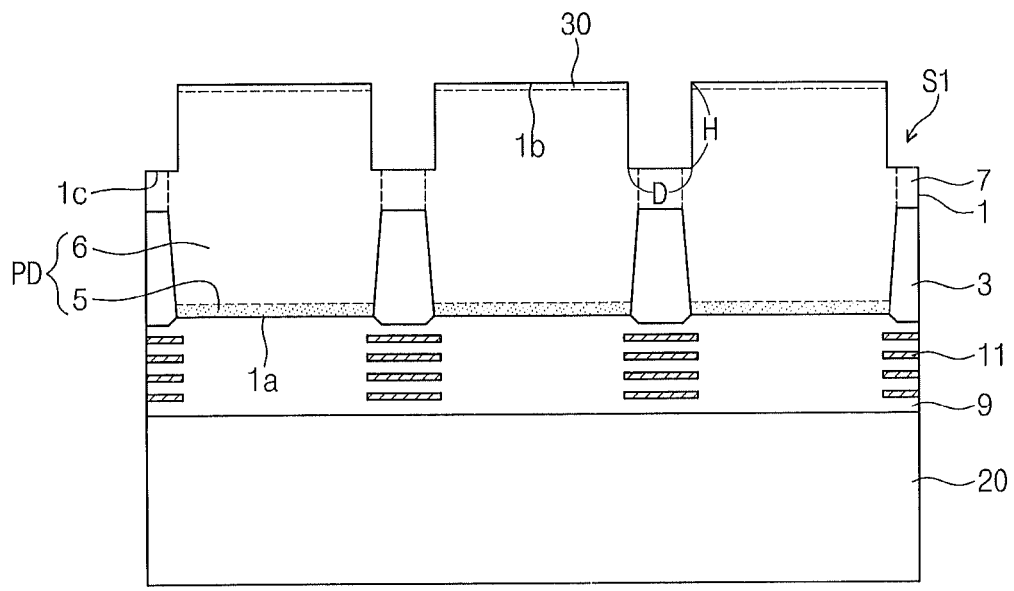
Figure 7:
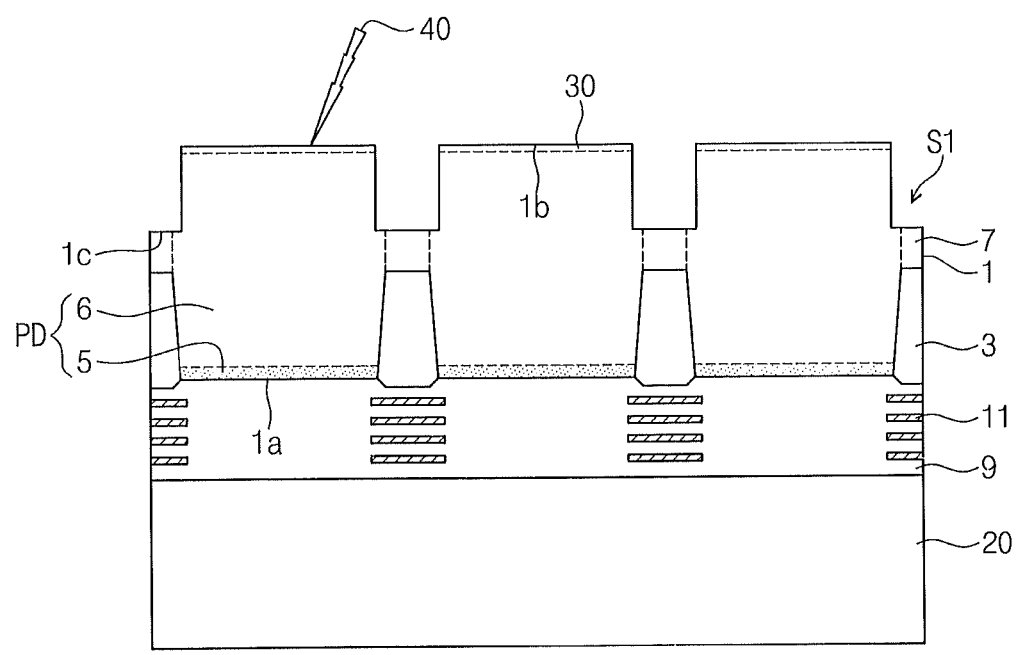

Referring to FIG. 6, the substrate 1 adjacent to the second surface 1b may be etched using the photoresist patterns 32 as etch masks, thereby forming substrate patterns S1 and a recessed second surface 1c between the substrate patterns S1. Here, an aspect ratio D/H of a distance D between the substrate patterns S1 to a depth H of the recessed second surface 1c may have a range of about 0.1 to about 5. Subsequently, the photoresist patterns 32 may be removed.

Figure 8A:
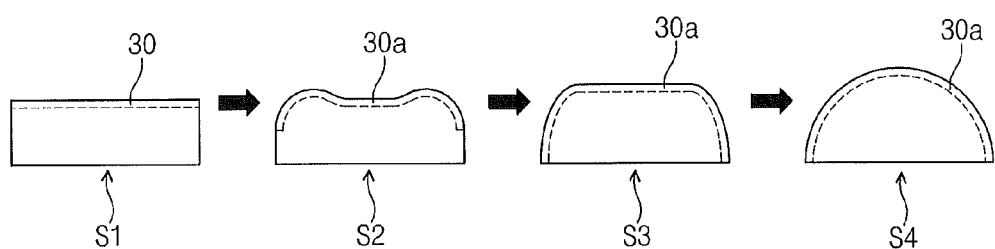
FIGS. 8A and 8B are cross-sectional views illustrating changed shapes of a substrate pattern according to the irradiation degree of a laser.
Figure 8B:
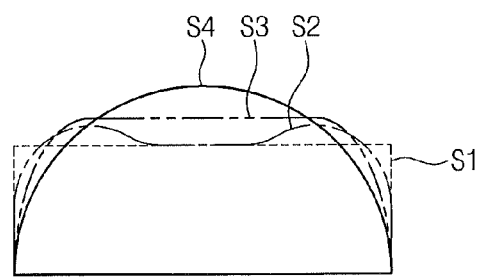
Figure 8C:
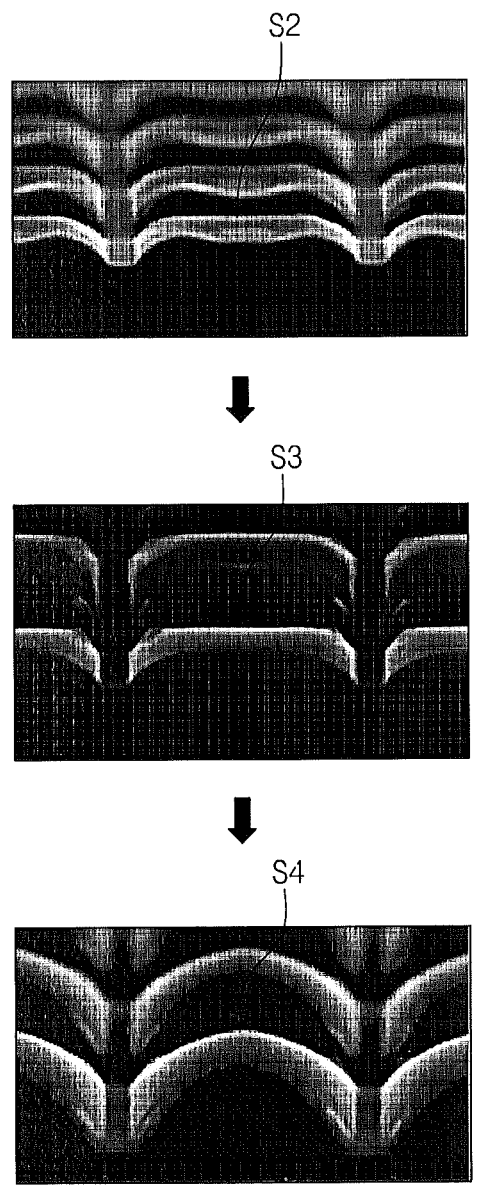
FIG. 8C shows photographs of manufactured substrate lens parts.
Figure 9:
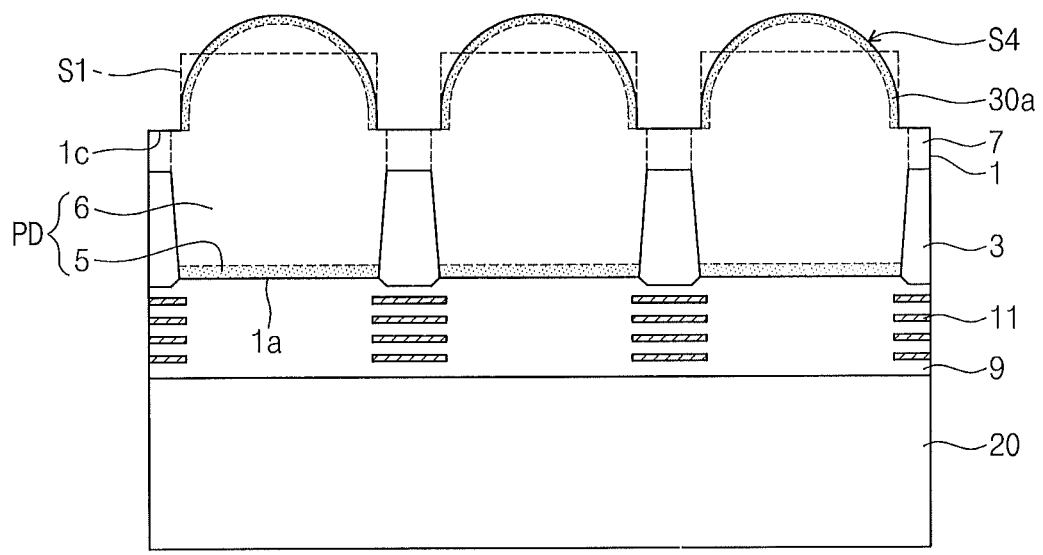

FIGS. 8A and 8B are cross-sectional views illustrating changed shapes of a substrate pattern according to irradiation degree of a laser. FIG. 8C shows photographs of manufactured substrate lens parts.

Referring to FIGS. 7, 8A, 8B, and 9, a laser 40 may be irradiated on the second surface 1b of the substrate 1 so that the substrate patterns S1 may be selectively heated. Here, the irradiated laser 40 may have a wavelength within a range of about 308 nm to about 550 nm and an energy density within a range of about 0.5 J/cm$^2$ to about 3 J/cm$^2$. Under the above condition, the laser 40 may heat only the substrate patterns S1 and may not influence structures (e.g., the interconnection layers 11) under the substrate patterns S1. At this time, the preliminary surface trap region 30 doped in the second surface 1b may improve an absorption coefficient of the laser 40, so that a temperature of the substrate patterns S1 may rapidly increase. A heating temperature of the substrate patterns S1 may have a range of about 1000 degrees Celsius to about 1450 degrees Celsius when the substrate 1 is formed of single crystalline silicon. The substrate patterns S1 may be changed as illustrated in FIGS. 8A and 8B during the irradiation of the laser 40. An edge portion of the substrate pattern S1 which is relatively less irradiated by the laser 40 may be changed into a round shape. A top surface of a center portion of the substrate pattern S1 on which the laser 40 is concentrated may remain substantially flat, i.e., level, such that no reference portion is significantly higher than another point of reference. At this time, the top surface of the center portion may be lower than the edge portion. The substrate pattern having the shape at this time is defined as a first substrate lens part S2 in the present specification. The dopants in the preliminary surface trap region 30 may be diffused into the substrate pattern S1 and be activated to be combined with semiconductor atoms of the substrate pattern 1 by the laser 40. Thus, a surface trap region 30a is formed. If the laser 40 is continuously irradiated, a sidewall of the first substrate lens part S2 may be more inclined and a level top surface may ascend. The shape at this time is defined as a second substrate lens part S3 in the present specification. If the laser 40 is continuously irradiated, the level top surface of the second substrate lens part S3 may become convex to present a more semi-spherical shape. The substrate pattern having the semi-spherical shape at this point is defined as a third substrate lens part S4 in the present specification. Referring to FIG. 8C, shape changes of the semiconductor lens parts S2, S3, and S4 were confirmed through actual experimentation. In the present embodiment, the substrate pattern S1 may be heated by the laser 40 until the shape of the third substrate S4 is formed.

Subsequently, referring to FIG. 3, first and second reflection preventing layers 50a and 50b may be conformally formed on the substrate lens part S4. The first and second reflection preventing layers 50a and 50b may include a silicon oxide layer, a silicon nitride layer, and a silicon oxynitride layer. Color filters 52a, 52b, and 52c may be formed on the second reflection preventing layer 50b. The color filters 52a, 52b, and 52c may include pigments of colors corresponding to the pixels, respectively. Even though not shown in the drawings, a planarization layer may be formed on or under the color filters 52a, 52b, and 52c. Micro lenses 54 may be formed. For example, after a photoresist pattern (not shown) including a transparent acrylic resin may be formed by a photolithography process, the photoresist pattern may reflow by heat, thereby forming the micro lenses 54.

Figure 10:
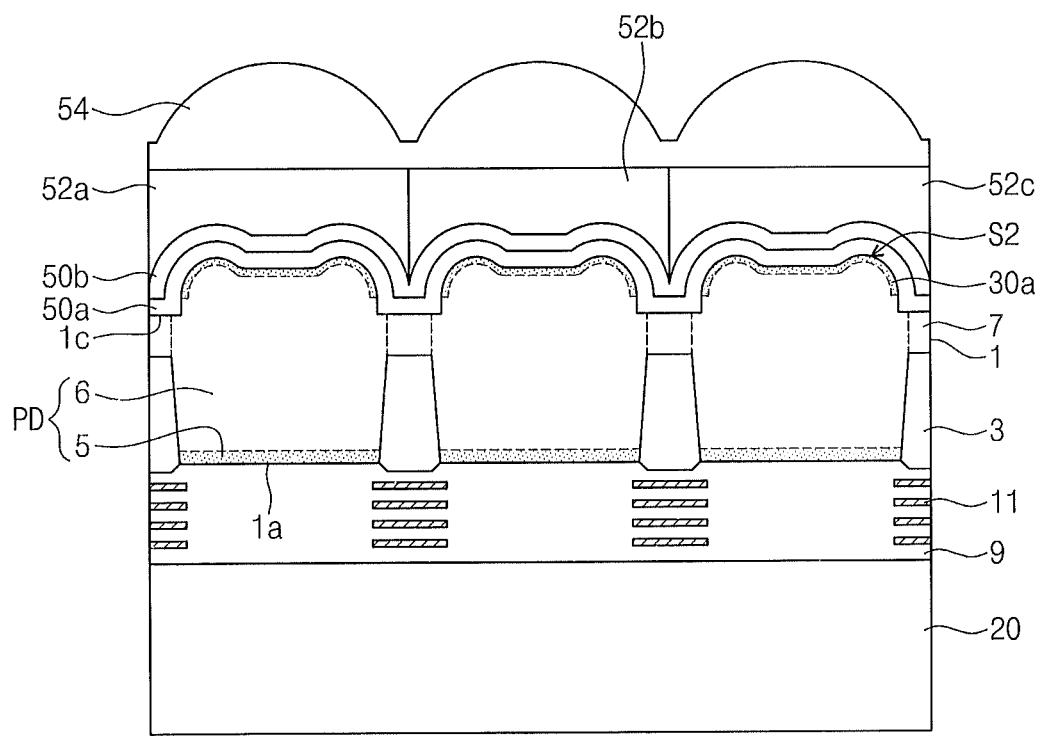
FIGS. 10 to 12 are cross-sectional views taken along a line I-I' of FIG. 2 to illustrate modified examples of the inventive concept.
Figure 11:
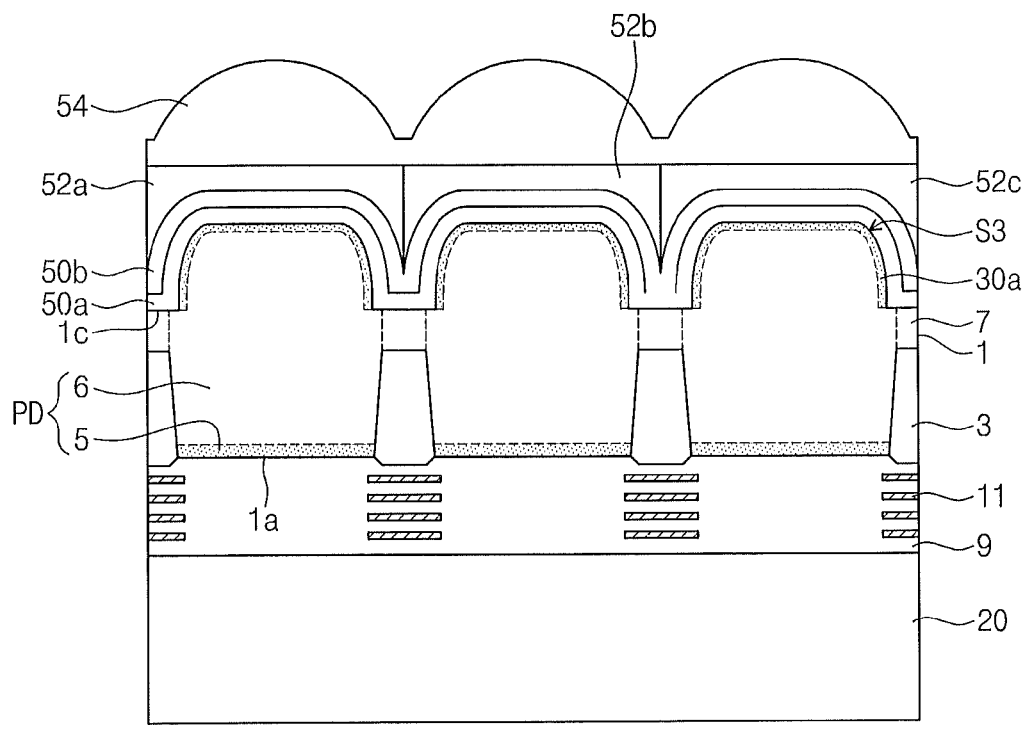
Figure 12:
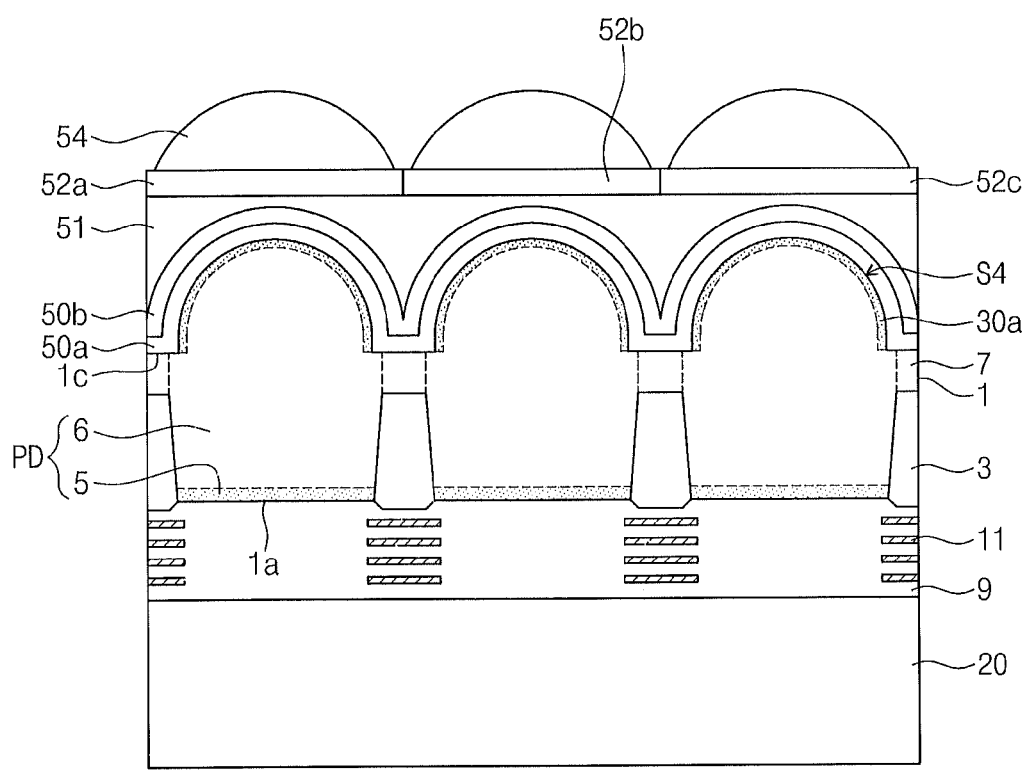

FIGS. 10 to 12 are cross-sectional views taken along a line I-I' of FIG. 2 to explain modified examples of the inventive concept.

Referring to FIG. 10, an image sensor according to the present modified example may include the first substrate lens part S2 of FIG. 8A. Other components of the image sensor according to the present modified example may be the same as corresponding components of the image sensor of FIG. 3.

Referring to FIG. 11, an image sensor according to the present modified example may include the second substrate lens part S3 of FIG. 8A. Other components of the image sensor according to the present modified example may be the same as corresponding components of the image sensor of FIG. 3.

Referring to FIG. 12, an image sensor according to the present modified example may include a planarization layer 51 disposed on the second reflection preventing layer 50b. The planarization layer 51 may include a silicon oxide-based material, a silicon nitride-based material, or a polymer material. The color filters 52a, 52b, and 52e may be disposed on the planarization layer 51. Other components of the image sensor according to the present modified example may be the same as corresponding components of the image sensor of FIG. 3.

Figure 13:
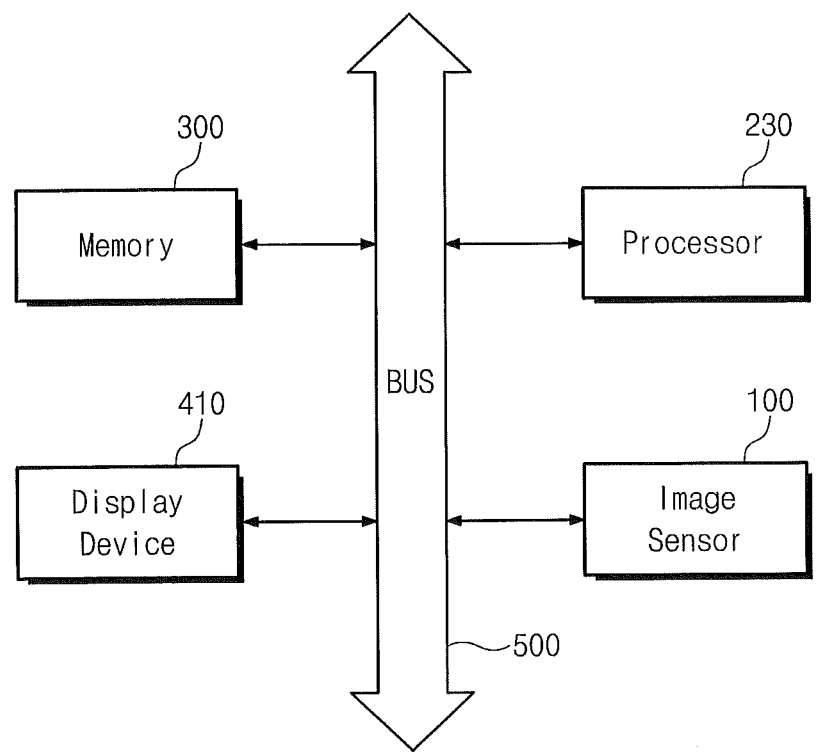
FIG. 13 is a block diagram illustrating an example of electronic devices including image sensors according to embodiments of the inventive concept.

FIG. 13 is a block diagram illustrating an example of electronic devices including image sensors according to embodiments of the inventive concept. The electronic device may be a digital camera or a mobile device. Referring to FIG. 13, a digital camera system may include an image sensor 100, a processor 230, a memory 300, a display device 410, and a bus 500. As illustrated in FIG. 13, the image sensor 100 may capture external image information in response to control of the processor 230. The processor 230 may store the captured image information in the memory 300 through the bus 500. The processor 230 may output the image information stored in the memory 300 to the display device 410.

According to embodiments of the inventive concept, the image sensor further includes the substrate lens part between the micro lens and the photoelectric conversion part. Thus, the light concentration may increase or be maximized and the interference between the pixels may decrease. Additionally, the surface trap region is disposed to be adjacent to the surface of the substrate lens part. Thus, charges (e.g., electrons) thermally generated from the photoelectric conversion part or dangling bonds of the surface of the substrate may be recombined in the surface trap region in the dark state, so that a dark current may be suppressed. Thus, the dark current characteristic may be improved. Moreover, the surface trap region may be conformally disposed along the surface of the substrate lens part, so that the photoelectric conversion part may extend into the substrate lens part and be in contact with the surface trap region. Thus, the photoelectric conversion part may become wider. As a result, the photo current may increase, so that the light sensitivity may be improved.

In the method of forming the image sensor according to embodiments of the inventive concept, after the back side of the substrate may be etched using the photoresist pattern as the etch mask to form the substrate pattern having the cross section of a quadrangle shape, the substrate pattern may be selectively heated using the laser to form various shapes of the substrate lens parts. Thus, the substrate pattern may be melted and then re-crystalized to form various shapes of silicon lenses. Additionally, an etch damage of the substrate pattern may be cured. Moreover, the impurities may be doped at the surface of the substrate pattern and may then be diffused and activated simultaneously with selective heating of the substrate pattern by the laser. Thus, the surface trap region may be formed to be adjacent to the surface of the substrate lens part. Accordingly, the image sensor with improved dark current characteristics may be more readily formed. Furthermore, the impurities doped at the surface of the substrate pattern may improve the absorption coefficient of the laser, so that anneal yield may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An image sensor comprising:
    a substrate including a first surface, a second surface on which light is incident, and a plurality of pixels, the first and second surfaces being opposite to each other;
    a photoelectric conversion component formed on the substrate of each of the respective pixels;
    a multi-layered interconnection and a multi-layered interlayer insulating layer on the first surface;
    a substrate lens component protruding from the second surface; and
    a surface trap region adjacent to a surface of the substrate lens component.

2. The image sensor of claim 1, wherein the substrate lens component has a semi-spherical shape.

3. The image sensor of claim 1, wherein the surface trap region includes at least one of boron, boron fluoride, fluorine, carbon, and germanium.

4. The image sensor of claim 1, wherein the surface trap region is conformally distributed along a surface of the substrate lens component.

5. The image sensor of claim 1, wherein the surface trap region traps charges generated from the photoelectric conversion component or a surface of the substrate in a dark current state.

6. The image sensor of claim 1, wherein the substrate lens component and the substrate constitute one structure; and
    wherein the photoelectric conversion component is in contact with the surface trap region.

7. The image sensor of claim 1, wherein the substrate lens component has a substantially level top surface.

8. The image sensor of claim 7, wherein an edge portion of the substrate lens component protrudes further than the substantially level top surface.

* * * * *